United States Patent
Dodd et al.

(10) Patent No.: US 7,245,174 B2
(45) Date of Patent: Jul. 17, 2007

(54) ANALOGUE SWITCH

(75) Inventors: Alan James Dodd, Oldham (GB); Joseph Andrew Jenkins, Oldham (GB); Anthony Philip Sullivan, Oldham (GB)

(73) Assignee: Zetex PLC, Oldham (GB)

( * ) Notice: Subject to any disclaimer, the term of this patent is extended or adjusted under 35 U.S.C. 154(b) by 7 days.

(21) Appl. No.: 11/231,527

(22) Filed: Sep. 21, 2005

(65) Prior Publication Data

US 2006/0066385 A1    Mar. 30, 2006

(51) Int. Cl.
*H03K 17/60* (2006.01)

(52) U.S. Cl. ...................................... 327/405; 327/411

(58) Field of Classification Search ................ 327/403, 327/405, 411, 417, 478, 407
See application file for complete search history.

(56) References Cited

U.S. PATENT DOCUMENTS

| 3,588,538 A | 6/1971 | Picallo |
| 4,581,541 A * | 4/1986 | Nakayama et al. ......... 327/384 |
| 4,588,902 A * | 5/1986 | Yazawa ....................... 327/318 |
| 6,140,859 A * | 10/2000 | Regier ......................... 327/478 |
| 6,515,518 B1 * | 2/2003 | Minegishi .................... 327/65 |
| 6,741,281 B1 | 5/2004 | Darthenay |
| 6,861,892 B1 * | 3/2005 | Edwards ..................... 327/374 |
| 2003/0112053 A1 | 6/2003 | Reber |

FOREIGN PATENT DOCUMENTS

| FR | 1484405 A | 6/1967 |
| GB | 1319167 A | 6/1973 |
| GB | 1474823 A | 2/1977 |

* cited by examiner

*Primary Examiner*—Dinh T. Le
(74) *Attorney, Agent, or Firm*—Foley & Lardner LLP

(57) ABSTRACT

A switching circuit (20) comprising first and second switch terminals (2,3) and a switch (21). The switch (21) comprises a first bipolar transistor (22), having a collector connected to the first switch terminal (2) and an emitter connected to the second switch terminal (3), and a second bipolar transistor (23), having an emitter connected to the first switch terminal (2) and a collector connected to the second switch terminal (3). The switch (21) can be turned on by supply of a control current to the base of either the first or the second bipolar transistor.

23 Claims, 4 Drawing Sheets

ANALOGUE SWITCH

CROSS-REFERENCE TO RELATED PATENT APPLICATIONS

Great Britain Priority Application 0421116.5, filed Sep. 23, 2004 including the specification, drawings, claims and abstract, is incorporated herein by reference in its entirety.

SUMMARY OF THE INVENTION

The present invention relates to an analogue switch. In particular, the invention relates to an analogue switch fabricated from bipolar transistors.

In the design of analogue circuits, in particular analogue integrated circuits, there is commonly a requirement for an analogue switch. An analogue switch operates such that when the switch is closed a voltage at a first switch terminal, derived from other parts of the circuit, is switched to a second switch terminal. A load, which may be a single component or a further portion of the circuit, is connected to the second switch terminal. Therefore, when the switch is closed, current passes though the switch to the load.

MOSFET transistors are commonly used as analogue switches as they are efficient because they may be turned on (i.e. closing the switch) without drawing any gate current. A MOSFET is turned on by applying a voltage to its gate. However, in the fabrication of analogue circuits it is often necessary to use bipolar transistors in preference to MOSFETs or other forms of transistors. This may be due to limitations imposed by the requirements of the circuit on the fabrication process. Combining bipolar and MOSFET circuits in a single integrated circuit increases the expense of the circuit. Therefore, there is often a requirement for an analogue switch fabricated from bipolar transistors.

A known form of analogue switch is formed from a single NPN bipolar transistor connected between first and second switch terminals. The collector of the transistor is connected to the first switch terminal and the emitter of the transistor is connected to the second switch terminal. A voltage source that is to be switched across a load is connected to the first switch terminal and a load is connected between the second switch terminal and ground or the negative power supply.

The switch is turned on by connecting a control current to the base of the transistor. This causes the transistor to connect the voltage at the first switch terminal to the second switch terminal. The transistor conducts current, causing current to flow through the load. When the control current is turned off, the switch is turned off. The transistor no longer conducts current.

This known analogue switch is relatively cheap, as it comprises a single transistor. However, it suffers from a number of disadvantages. Firstly, the switch only operates efficiently when the voltage to be switched i.e. the voltage at the first switch terminal, is higher than the voltage at the second switch terminal.

It will be appreciated that the switch could alternatively be fabricated using a PNP bipolar transistor. In this alternative form, the switch only operates efficiently if the voltage at the first switch terminal is lower than the voltage at the second switch terminal. This may be undesirable as the voltage to be switched at the first switch terminal may be varying with time, and may range between voltage values higher and lower than the voltage at the second switch terminal.

The reason for this lack of bi-directional operation is that bipolar transistors can only efficiently conduct current when operating in the forward operating mode. When operating in the inverse operating mode (for an NPN transistor when the voltage at the emitter is higher than the voltage at the collector and vice versa for a PNP transistor) the transistor has a very low current gain. Consequently, when in the inverse operating mode the analogue switch is only able to pass a very low current to the load for a given size of control current.

A further problem of this single bipolar transistor analogue switch is that bipolar transistors have an offset voltage between the collector and the emitter. Consequently, there will be an offset voltage between the first and second switch terminals when the switch is turned on, but no current is flowing through the transistor. This offset voltage is undesirable as an ideal analogue switch when turned on replicates the voltage at the first switch terminal at the second switch terminal exactly when no current is flowing. It will be appreciated that this offset voltage is also present when the current is flowing through the transistor. When current flows through the transistor there is a further unrelated offset voltage due to the resistance between the collector and the emitter of the transistor.

The majority of the control current supplied to the base of the transistor to turn the switch on flows through the emitter of the transistor to ground through the load. Consequently, when the transistor is turned on, there will also be an offset voltage generated across the load. In order to counteract this offset voltage across the load further circuitry is required to generating a compensating voltage, increasing the cost and the complexity of the circuit. Due to this complexity, in practice this compensated circuitry is not provided.

The problems associated with the offset voltage across the load are exacerbated by the fact that the proportion of the control current that passes through the emitter to ground is unknown. Part of the control current is drawn off by a parasitic transistor. The parasitic transistor is formed between the base of the switch transistor and the device substrate. For an NPN switch transistor fabricated upon a P-type substrate a parasitic PNP bipolar transistor is formed. The emitter of the parasitic PNP transistor is the base of the switch transistor, the base of the parasitic transistor is the collector of the switch transistor, and the collector of the parasitic transistor is the substrate of the device. This is known as the substrate PNP effect. For a PNP switch transistor there is no direct equivalent of the substrate PNP effect.

The proportion of the control current drawn off by this parasitic transistor is unknown, as the current gain of the parasitic transistor is dependent upon slight variations in the fabrication process. Consequently, the precise proportion of the control current passing through the emitter of the switch transistor and then through the load to ground is unknown. This results in the offset voltage across the load being unknown. Therefore, the offset voltage cannot easily be compensated for.

The identified problems of lack of bi-directional operation, collector-emitter offset voltage, control current flowing to earth through the load and the substrate PNP effect are unique to bipolar transistors. In particular, MOSFETS do not suffer from these problems, partly because the gate of a MOSFET draws zero current. However, for some applications bipolar transistor technology is preferable, and there therefore remains a requirement for high quality bipolar transistor based analogue switches that suffer less from these identified problems.

It is an object of the present invention to obviate, or mitigate, one or more of the problems identified above. In particular, it is an object of the present invention to provide a bipolar transistor based analogue switch that obviates, or mitigates, one or more of the problems identified above.

According to the present invention there is provided a switching circuit comprising first and second switch terminals and a switch comprising a first bipolar transistor, having a collector connected to the first switch terminal and an emitter connected to the second switch terminal, and a second bipolar transistor, having an emitter connected to the first switch terminal and a collector connected to the second switch terminal, such that the switch can be turned on by supply of a control current to the base of at least one of the first or the second bipolar transistor.

An advantage of the present invention is that the analogue switch allows for bi-directional current flow. The switch may operate efficiently with the voltage at the first switch terminal being higher than the voltage at the second switch terminal, or the other way round. As such, the load may be connected to either switch terminal. Additionally, the offset voltage across the switch is significantly reduced compared with the offset voltage for an analogue switch in accordance with the prior art.

The switching circuit may further comprise a first current source for supply of a first control current to the base of the first transistor. The switching circuit may further comprise a second current source for supply of a second control current to the base of the second transistor. Alternatively, the switching circuit may further comprise a common current source for supply of said control current to the base of each transistor. The common current source may be arranged to supply said control current to the base of each transistor either independently or together.

An advantage of the present invention is that the switch may be turned on by supplying current to either or both of the bases of the first and second transistors. If the voltage to be switched at the first switch terminal is higher than the voltage at the second switch terminal then the switch may most simply be turned on by supplying the first control current to the base of the first transistor. If the voltage to be switched at the first switch terminal is lower than the voltage at the second switch terminal then the switch may be most simply turned on by supply the second control current to the base of the second transistor. Alternatively, and most simply the control current may be supplied to the bases of both transistors. Supplying the control current to the bases of both transistors is advantageous as this removes the need to determine the relative voltage levels at the switch terminals before turning the switch on.

A further advantage of the present invention is that the control current to the first and second transistors may be supplied from separate current sources or a common current source. The common current source may supply the control current to both transistors at the same time, or independently.

Preferably, the first and second bipolar transistors are matched transistors.

Preferably, the switching circuit further comprises a slave switching circuit comprising first and second slave terminals, a slave switch, the slave switch comprising a third bipolar transistor, having a collector connected to the first slave terminal and an emitter connected to the second slave terminal, and a fourth bipolar transistor, having an emitter connected to the first slave terminal and a collector connected to the second slave terminal, a first controlled current source having a programming input connected to the first slave terminal and a current output connected to the first switch terminal and a second controlled current source having a programming input connected to the second slave terminal and a current output connected to the second switch terminal. The slave switch can be turned on by supply of a slave control current to the base of at least one of the third or the fourth bipolar transistor.

The slave switching circuit may further comprise a first slave current source for supply of a first slave control current to the base of the third transistor, the first slave control current being matched to the first control current. The slave switching circuit may further comprise a second slave current source for supply of a second slave control current to the base of the fourth transistor, the second slave control current being matched to the second control current. The slave switching circuit may further comprise a slave common current source for supply of said slave control current to the base of the third and fourth transistors, the slave control current being matched to the control current. The slave common current source may be arranged to supply said control current to the base of the third and fourth transistors either independently or together.

The switching circuit may further comprise a common current source for supply of said control current to the base of each of the first and second transistors and for supply of said slave control current to the base of each of to the third and fourth transistors. The common current source may be arranged to supply said control current and said slave control current to the bases of the first and third transistors and the second and fourth transistors either independently or together.

Preferably, the third bipolar transistor is matched to the first bipolar transistor and the fourth bipolar transistor is matched to the second bipolar transistor.

Preferably, said transistors are arranged in a common centroid arrangement.

Preferably, said controlled current sources comprise current mirrors. Preferably, said current mirrors comprise Wilson current mirrors.

Preferably, the programming input of the first controlled current source is connected to the first slave terminal via a first biasing resistor, and the programming input of the second controlled current source is connected to the second slave terminal via a second biasing resistor.

Preferably, the resistance of the first biasing resistor is equal to the resistance of the second biasing resistor.

Preferably, said switching circuit is fabricated as a monolithic integrated circuit.

A load may be connected to either switch terminal, such that the switch supplies current to the load.

DETAILED DESCRIPTION OF THE PREFERRED EMBODIMENTS

Figure 1:
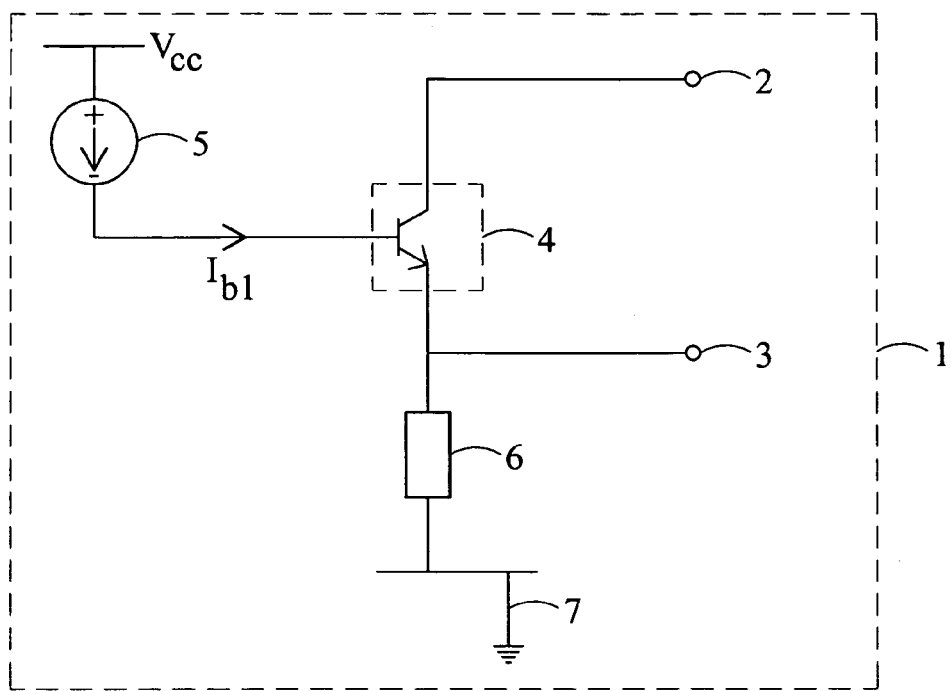
FIG. 1 illustrates a prior art switching circuit.

Referring first to FIG. 1, this illustrates a known form of analogue switching circuit 1 having two switch terminals 2, 3. Switching circuit 1 has a switch comprising an NPN bipolar switch transistor 4 connected between the switch terminals 2, 3. The collector of transistor switch 4 is connected to the first switch terminal 2 and the emitter of transistor switch 4 is connected to the second switch terminal 3. A voltage to be switched is connected to the first switch terminal 2. This voltage may be derived from a power supply, or may be a voltage signal derived from other connected circuitry (not shown).

A load 6 is connected between the second switch terminal 3 and ground 7. The transistor switch 4 operates to switch the voltage at switch terminal 2 to switch terminal 3. Consequently, transistor switch 4 switches the voltage at switch terminal 2 across the load 6.

Transistor 4 is turned on, i.e. is driven into saturation, by a control current $I_{b1}$ applied to the base of the transistor 4. Control current $I_{b1}$ is supplied by current source 5, connected between the base of transistor 4 and the voltage supply $V_{cc}$. Current source 5 is controllable, in response to a control signal generated externally (not shown), in order to control the flow of current through transistor switch 4.

When the transistor 4 is driven into saturation current may flow between the switch terminals 2, 3. This current flow then passes to the load 6, i.e. the switch has been closed. When the control current $I_{b1}$ is turned off, transistor 4 no longer conducts current between the switch terminals 2, 3, i.e. the switch 1 becomes open.

As discussed in the introduction, this form of analogue switch suffers from a number of disadvantages. Firstly, the switching circuit 1 only works efficiently when the voltage to be switched at switch terminal 2 is higher than the voltage at switch terminal 3. However, it is often desirable for an analogue switch to able to operate when the relative voltages of the switch terminals may be either way round. For instance, this may be desirable where the voltage to be switched at switch terminal 2 is a time varying signal, which may vary between positive and negative values.

Secondly, the offset voltage between the collector and the emitter of transistor 4, and consequently between switch terminals 2, 3, may be as high as tens of millivolts. Therefore, there will be an offset voltage across bipolar transistor switch 4 when there is no current flowing through the switch. An ideal switch would replicate the voltage of switch terminal 2 at switch terminal 3 under zero current flow conditions.

Thirdly, as described in the introduction, when control current $I_{b1}$ is supplied to the base of transistor 4 to turn switching circuit 1 on this current must flow to ground. Consequently, when switching circuit 1 is turned on, there will be an offset voltage generated across load 6 equal to the product of the resistance of load 6 and the control current 7. This problem of the offset voltage across load 6 is exacerbated by the substrate PNP effect.

Figure 2:
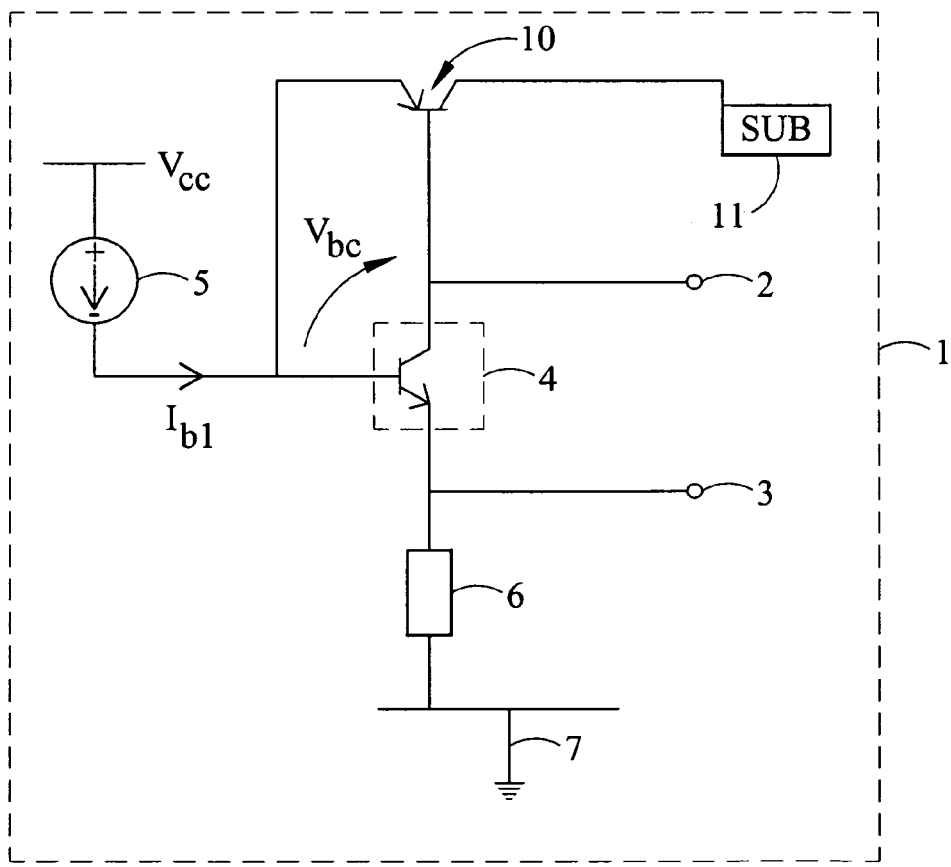
FIG. 2 schematically illustrates the problem of the parasitic transistor associated with the switching circuit of FIG. 1.

FIG. 2 illustrates the prior art analogue switching circuit 1 of FIG. 1, depicting a parasitic PNP transistor 10. Parasitic transistor 10 shares its emitter with the base of transistor 4, i.e. both are formed by the same region of P-type semiconductor. The base of parasitic transistor 10 is the same region as the collector of transistor 4 and the collector of parasitic transistor 10 is formed by the substrate 11 of the semiconductor device.

Because transistor 4 is operated in saturation, the base collector junction of transistor 4 becomes forward biased, i.e. $V_{bc}$ becomes positive. Consequently, the base emitter junction for parasitic transistor 10 becomes forward biased and transistor 10 conducts a portion of $I_{b1}$ to ground via the substrate of the semiconductor device. The current gain of transistor 10 is not high as it is a parasitic transistor. However, the proportion of current it draws from $I_{b1}$ is unknown. The current drawn depends upon the manner in which the semiconductor device is fabricated. It is typically between 15% and 25%.

As the proportion of $I_{b1}$ passing through the load 6 is unknown the precise offset voltage across the load is unknown, and therefore cannot easily be compensated for.

Figure 3:
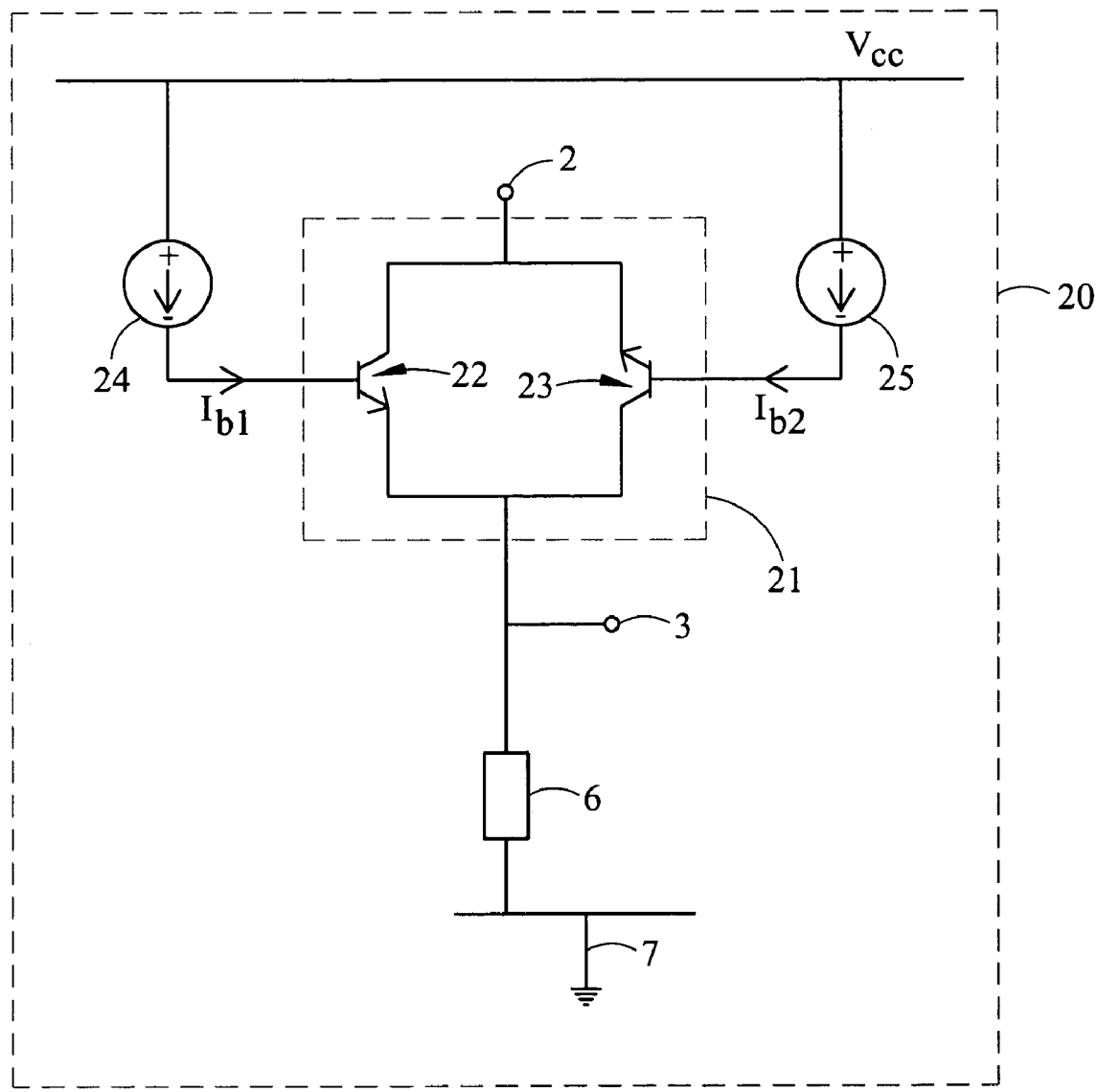
FIG. 3 illustrates a switching circuit in accordance with a first embodiment of the present invention.

Referring now to FIG. 3 this illustrates an analogue switching circuit 20 in accordance with a first embodiment of the present invention, which is a modification of the prior art analogue switching circuit of FIG. 1. Components common to the circuits of FIGS. 1 and 3 are identified by the same reference numerals. Switching circuit 20 comprises an analogue switch 21 in accordance with the present invention connected between the first and second switching terminals 2, 3. Switch 21 comprises a first bipolar transistor 22 having its collector connected to the first switch terminal 2 and its emitter connected to the second switch terminal 3. Switch 21 further comprises a second bipolar transistor 22 having its emitter connected to the first switch terminal 2 and its collector connected to the second switch terminal 3.

This back to back arrangement of transistors may be turned on, i.e. allowing current to pass between the switch terminals 2, 3 by applying control currents $I_{b1}$ and $I_{b2}$ to the bases of transistor 22 and 23 respectively. Control current $I_{b1}$ is controlled by a first current source 24 and control current $I_{b2}$ is controlled by a second current source 25. Current sources 24 and 25 are connected between the positive power supply $V_{cc}$ and the bases of transistors 22 and 23 respectively. The control current is turned on by control signals generated by external circuitry (not shown) and passed to current sources 24 and 25.

Due to the back-to-back arrangement of transistors 22 and 23 there is a significant degree of symmetry in the operation of the switch 21. If switch terminal 2 is positive with respect to switch terminal 3 then the switch 21 will conduct predominantly through transistor 22. However, if switch terminal 2 is negative with respect to switch terminal 3 then the switch 21 will conduct predominantly through transistor 23. Consequently, regardless of the voltage at switch terminals 2 and 3 the switch 21 will conduct via the forward operating mode of either transistor 22 or 23. Therefore, the problem of lack of bi-directional operation of the prior art is overcome.

Additionally, as with the transistor switch 4 of FIG. 1, each transistor 22, 23 will have an offset voltage between their respective collectors and emitters. Due to the increased symmetry of switch 21, i.e. the fact that the offset voltages are arranged in opposite directions, the overall offset voltage is reduced compared to that of switch 4 in FIGS. 1 and 2. The reduction of offset voltage is typically around 50%.

Another advantage of the present invention is that due to the bi-directional nature of analogue switch 21 the load 6 may be connected to either switch terminal 2 or switch terminal 3.

Figure 4:
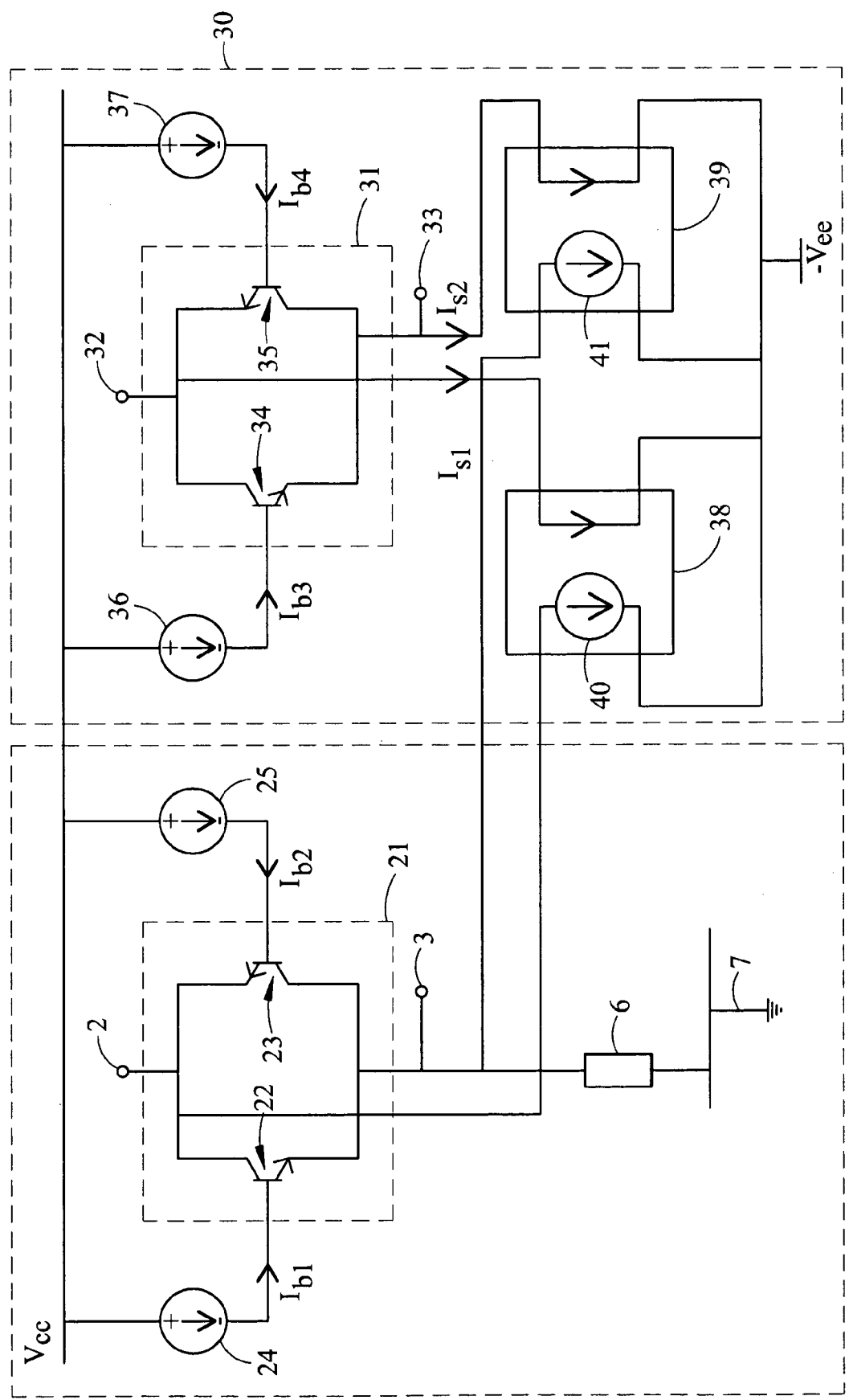
FIG. 4 illustrates, a switching circuit in accordance with a second embodiment of the present invention.

Referring now to FIG. 4, this illustrates a switching circuit comprising switching circuit 20 and a slave switching circuit 30 according to a second embodiment of the present invention. Switching circuit 20 is identical to that shown in FIG. 3, except for the additional connections to slave switching circuit 30. The same reference numerals will be used to refer to components common to FIGS. 3 and 4.

Slave switching circuit 30 comprises a slave switch 31 connected between first and second slave terminals 32, 33. The slave switch 31 is a duplicate of the analogue switch 21, comprising third and fourth bipolar transistors 34, 35. Third transistor 34 has its collector connected to the first slave terminal 32 and its emitter connected to the second slave terminal 33. Fourth transistor 35 has its emitter connected to the first slave terminal 32 and its collector connected to the second slave terminal 33.

Third and fourth transistors 34, 35 are turned on by slave control currents Ib3 and Ib4 respectively. Slave control currents Ib3 and Ib4 mirror control currents Ib1 and Ib2 respectively, and consequently slave switch 30 is turned on whenever analogue switch 20 is turned on. Slave control currents Ib3 and Ib4 are set by slave current sources 36 and 37 respectively, which are connected between the positive power supply Vcc and the bases of transistors 34, 35 respectively.

Transistors 34 and 35 are matched to transistors 22 and 23 respectively. When the switching circuit is fabricated, all four transistors are located close to each other on the same section of semiconductor. This is in order to minimise any variation in transistor behaviour due to slight manufacturing tolerances across the semiconductor device. This serves to reduce any variation in offset voltage. Transistors 22, 23, 34, 35 are arranged in a common centroid arrangement, whereby the transistors are fabricated in a square with transistor pairs 22, 23 and 34, 35 forming the diagonals of the square. This further improves the matching of the transistors. Therefore, transistors 34, 35 suffer from the same substrate PNP problems as their respective match. Consequently, the same biasing current due to the residual of the control currents trying to flow to ground will flow out of slave terminals 32, 33 as flows out of switch terminals 2, 3.

The currents flowing from slave terminals 32, 32 are Is1 and Is2 respectively. Currents Is1 and Is2 are taken to current controlled current sources 38 and 39 and form the programming input of each current source 38, 39.

Current controlled current sources 38, 39 are current mirrors. These should be high quality current sources with a accurate gain of 1. A Wilson current mirror, known in the art, meets these requirements. The programming currents Is1 and Is2 give rise to a controlled current of the same magnitude passing through the controlled outputs 40, 41 of the current mirrors. As slave switch 31 is matched to analogue switch 21 the result is that the currents output by the controlled current sources 38, 39 are exactly equal to the bias currents passing out of switch terminals 2, 3 as a result of the control currents $I_{b1}$ and $I_{b2}$ applied to the bases of transistors 22 and 23. Switch terminals 2 and 3 are connected to the controlled current channels 40 and 41 of controlled current sources 38 and 39. Consequently, the bias currents from switch terminals 2 and 3 are constrained to pass through the current mirrors 38, 39 to the negative power supply $V_{ee}$ instead of passing through the load 6 connected to switch terminal 3 and then to earth. Therefore, no bias voltage is created across the load 6.

The switch 21 may be turned on by turning on current sources 24, 25. In order to ensure none of control currents $I_{b1}$ and $I_{b2}$ flows through load 6 current sources 36, 37 should be turned on and off at the same times as current sources 24, 25 are turned on and off. In the embodiment of the present invention depicted in FIG. 4 the controls $I_{b1}$, $I_{b2}$ instead flow into current controlled current sources 38, 39. The maximum current that may flow through the switch 21 to the load 6 is determined by $\beta.I_{b1}$ or $\beta.I_{b2}$ where $\beta$ is the current gain of either transistor 22 or transistor 23.

Consideration of the symmetry of the arrangement of FIG. 4 reveals that transistors 22 and 23 are biased identically, with equal voltages across the two pairs of base-collector and base-emitter junctions, when transistors 22 and 23 are turned on simultaneously.

The embodiment of the present invention as depicted in FIG. 4 is able to operate over a wide range of voltages, with the voltages at switch terminals 2, 3 operable to within approximately 1V of the power supply voltages $V_{cc}$ and $-V_{ee}$. The limit of 1V is due to the small voltage drop across each current source 24, 25 and the diode drop between the base and the collector or the base and the emitter of either transistor 22 or 23.

Analogue switch 21 and slave switch 31 are generally fabricated as part of a monolithic integrated circuit. Therefore, this matching process additionally takes account of the substrate PNP effect. With the bias current diverted away from passing through the load 6, the result is that when the switching circuit 21 is turned on the voltage at switch terminal 2 is more closely matched at switch terminal 3.

The circuit is therefore an almost perfect zero offset switch (under no load current conditions). The switch resistance is determined by the physical geometry of transistors 22 and 23, and can be reduced by making transistors 22 and 23, together with the matched slave transistors 34, 35, larger.

Figure 5:
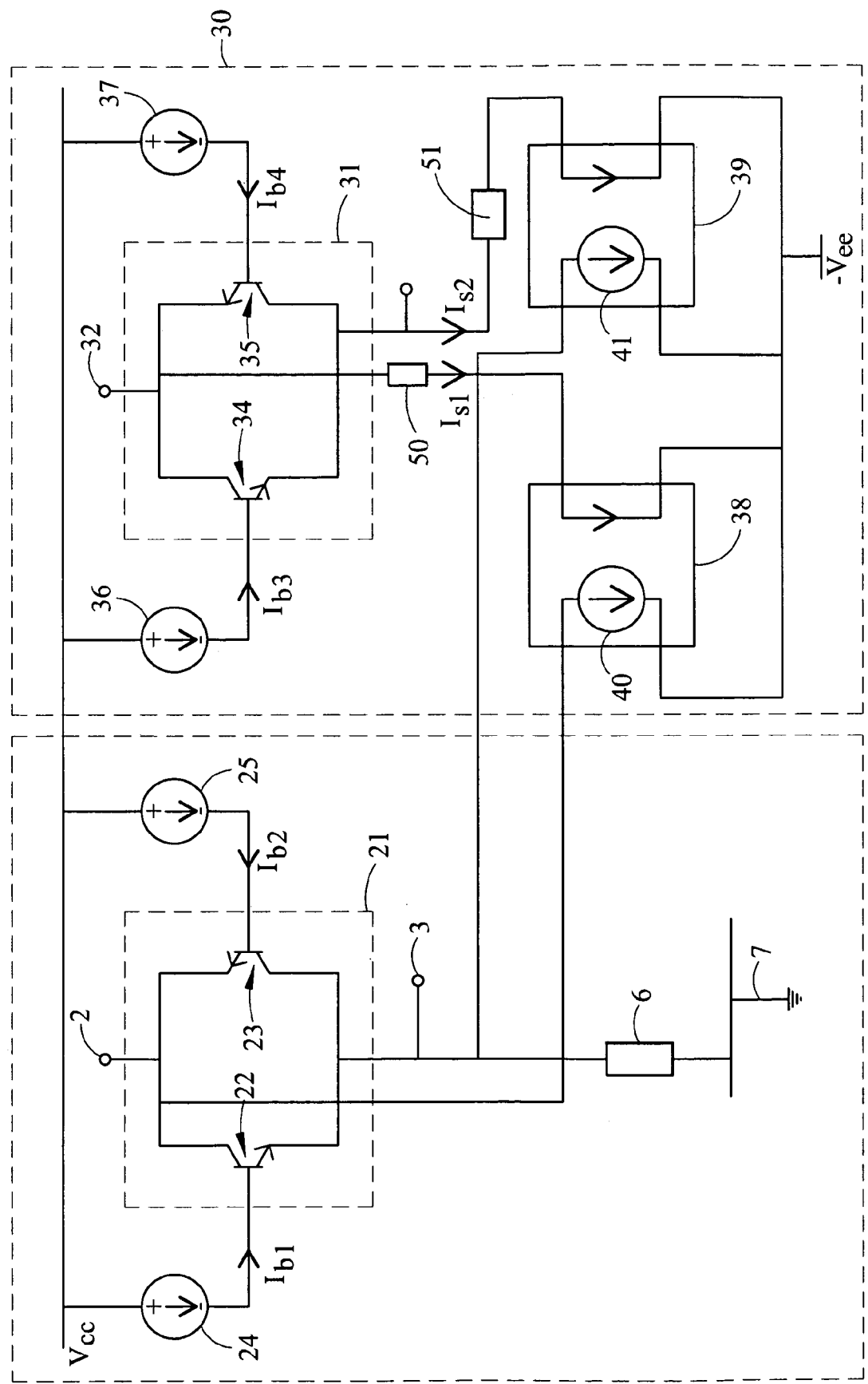
FIG. 5 illustrates a switching circuit in accordance with a third embodiment of the present invention.

The compensation provided by the slave switch 30 works most efficiently if the slave terminals are biased approximately half way between $V_{cc}$ and $-V_{ee}$. FIG. 5 illustrates a modification of the embodiment of the invention of FIG. 4 to achieve this biasing. Bias resistors 50 and 51 are provided between slave terminals 32 and 33 and controlled current sources 38 and 39 respectively. The resistance of each bias resistor, $R_{bias}$ in order to bias the slave switch mid rail should be set to:

$$R_{bias}=(V_{cc}-V_{ee}-2*V_{in\ cccs})/(I_{s1}+I_{s2})$$

where $V_{in\ cccs}$ is the input voltage of the current controlled current sources 38, 39.

In practice the value of $R_{bias}$ would need to be adjusted slightly to take into account the typical substrate PNP current loss in transistors 34, 35. However, as the precise level at which slave switch 31 is biased is not critical, this adjustment is not usually necessary.

It will be readily apparent to the appropriately skilled person that for the embodiments of the present invention depicted in FIGS. 4 and 5 the control current supplied to the bases of transistors 22 and 23 (and consequently matched for transistors 34 and 35) may be different. Further, to turn on switching circuit 21, the control current need only be applied to either transistor 22 or transistor 23 depending on whether the voltage at switch terminal 2 is higher than the voltage at switch terminal 3 or vice versa. However, for simplicity it is preferable to apply the control current to both transistors 22 and 23, (and consequently the slave control current to both transistors 34 and 35).

The control currents may be supplied by separate current sources as described above, or alternatively a common current source may provide the control currents and a separate common current source may provide the slave control currents. For this alternative arrangement, the bases of transistors 22, 23 and/or 34, 35 would be connected together. Another option is for a single common current source to provide all control currents and slave control currents.

The voltage supply for the analogue switch 21 and the slave switch 31 may be different, though as the analogueue switch 21 and the slave switch 31 are supplied with the same (slave) control currents there is no advantage in doing this. Additionally, although the description above refers to an analogue switch being fabricated as a monolithic integrated circuit, switching circuit 20 (and slave switching circuit 30) may also be fabricated from discrete components. Such a fabrication, however, would increase the difficulty of obtaining matched transistors, and additionally for a discrete analogueue switching circuits it is easier to use MOSFET switches.

Current controlled current sources 38, 39 may typically be Wilson current mirrors. However, any of form of current mirror known in the art that provides an accurate gain of 1 may also be used.

NPN transistors are used in preference to PNP transistors for the switching elements as they work more efficiently, owing to the greater mobility of electrons over holes and also NPN transistors having lower on resistance. However, PNP transistors may be used for auxiliary parts of the overall circuit such as the current sources 24, 25, 36, 37.

Further modifications, and applications, of the present invention will be readily apparent to the appropriately skilled person.

What is claimed is:

1. A switching circuit comprising:
    first and second switch terminals;
    a switch comprising a first bipolar transistor, having a collector connected to the first switch terminal and an emitter connected to the second switch terminal, and a second bipolar transistor, having an emitter connected to the first switch terminal and a collector connected to the second switch terminal, such that the switch can be turned on by supply of a control current to the base of at least one of the first or the second bipolar transistor; and
    a slave switching circuit comprising:
    first and second slave terminals;
    a slave switch, the slave switch comprising a third bipolar transistor, having a collector connected to the first slave terminal and an emitter connected to the second slave terminal, and a fourth bipolar transistor, having an emitter connected to the first slave terminal and a collector connected to the second slave terminal;
    a first controlled current source having a programming input connected to the first slave terminal and a current output connected to the first switch terminal; and
    a second controlled current source having a programming input connected to the second slave terminal and a current output connected to the second switch terminal;
    wherein the slave switch can be turned on by supply of a slave control current to the base of at least one of the third or the fourth bipolar transistor.

2. A switching circuit according to claim 1, wherein the switching circuit further comprises a first current source for supply of a first control current to the base of the first transistor.

3. A switching circuit according to claim 2, wherein the slave switching circuit further comprises a first slave current source for supply of the slave control current to the base of the third transistor, the slave control current being matched to the first control current.

4. A switching circuit according to claim 2, wherein the switching circuit further comprises a second current source for supply of a second control current to the base of the second transistor.

5. A switching circuit according to claim 4, wherein the slave switching circuit further comprises a second further slave current source for supply of a further slave control current to the base of the fourth transistor, the further slave control current being matched to the second control current.

6. A switching circuit according to claim 1, wherein the switching circuit further comprises a common current source for supply of said control current to the base of each transistor.

7. A switching circuit according to claim 6, wherein the common current source is arranged to supply said control current to the base of each transistor together.

8. A switching circuit according to claim 6, wherein the slave switching circuit further comprises a slave common current source for supply of said slave control current to the base of the third and fourth transistors, the slave control current being matched to the control current.

9. A switching circuit according to claim 8, wherein the slave common current source is arranged to supply said control current to the base of the third and fourth transistors together.

10. A switching circuit according to claim 1, wherein the first and second bipolar transistors are matched transistors.

11. A switching circuit according to claim 1, wherein the switching circuit further comprises a common current source for supply of said control current to the base of each of the first and second transistors and for supply of said slave control current to the base of the third and fourth transistors.

12. A switching circuit according to claim 11, wherein the common current source is arranged to supply said control current and said slave control current to the bases of the first and third transistors and the second and fourth transistors together.

13. A switching circuit according to claim 1, wherein the third bipolar transistor is matched to the first bipolar transistor and the fourth bipolar transistor is matched to the second bipolar transistor.

14. A switching circuit according to claim 1, wherein said transistors are arranged in a common centroid arrangement.

15. A switching circuit according to claim 1, wherein said controlled current sources comprise current mirrors.

16. A switching circuit according to claim 15, wherein said current mirrors comprise Wilson current mirrors.

17. A switching circuit according to claim 1, wherein the programming input of the first controlled current source is connected to the first slave terminal via a first biasing resistor, and the programming input of the second controlled current source is connected to the second slave terminal via a second biasing resistor.

18. A switching circuit according to claim 17, wherein the resistance of the first biasing resistor is equal to the resistance of the second biasing resistor.

19. A switching circuit according to claim 1, wherein said switching circuit is fabricated as a monolithic integrated circuit.

20. A switching circuit according to claim 1, wherein a load is connected to either the first switch terminal or the second switch terminal, such that either the first switch terminal or the second switch terminal-supplies current to the load.

21. A switching circuit according to claim 6, wherein the common current source is arranged to supply said control current to the base of each transistor independently.

22. A switching circuit according to claim 8, wherein the slave common current source is arranged to supply said control current to the base of the third and fourth transistors independently.

23. A switching circuit according to claim 11, wherein the common current source is arranged to supply said control current and said slave control current to the bases of the first and third and the second and fourth transistors independently.

* * * * *